United States Patent
Duggan et al.

(10) Patent No.: US 9,331,717 B2
(45) Date of Patent: May 3, 2016

(54) FORWARD ERROR CORRECTION DECODING AVOIDANCE BASED ON PREDICTED CODE BLOCK RELIABILITY

(75) Inventors: Jason Robert Duggan, Kanata (CA); Andrew Mark Earnshaw, Kanata (CA); Timothy James Creasy, Kanata (CA)

(73) Assignee: BlackBerry Limited, Waterloo (CA)

( * ) Notice: Subject to any disclaimer, the term of this patent is extended or adjusted under 35 U.S.C. 154(b) by 2187 days.

(21) Appl. No.: 12/394,162

(22) Filed: Feb. 27, 2009

(65) Prior Publication Data

US 2010/0223524 A1 Sep. 2, 2010

(51) Int. Cl.
| | |
|---|---|
| *H04L 12/28* | (2006.01) |
| *H03M 13/37* | (2006.01) |
| *H03M 13/00* | (2006.01) |
| *H04L 1/00* | (2006.01) |
| *H04L 1/20* | (2006.01) |
| *H03M 13/11* | (2006.01) |
| *H03M 13/15* | (2006.01) |
| *H03M 13/23* | (2006.01) |
| *H03M 13/29* | (2006.01) |
| *H04L 1/18* | (2006.01) |

(52) U.S. Cl.
CPC ...... *H03M 13/3707* (2013.01); *H03M 13/6306* (2013.01); *H04L 1/0021* (2013.01); *H04L 1/0036* (2013.01); *H04L 1/0045* (2013.01); *H04L 1/0053* (2013.01); *H04L 1/1829* (2013.01); *H04L 1/20* (2013.01); *H03M 13/1102* (2013.01); *H03M 13/15* (2013.01); *H03M 13/1515* (2013.01); *H03M 13/23* (2013.01); *H03M 13/2909* (2013.01); *H03M 13/2957* (2013.01); *H04L 1/1812* (2013.01)

(58) Field of Classification Search
CPC ............ H04W 52/241; H04W 52/265; H04W 72/085; H04W 36/30; H04W 52/225; H04L 12/28
USPC .......................................................... 714/752
See application file for complete search history.

(56) References Cited

U.S. PATENT DOCUMENTS

| | | | | |
|---|---|---|---|---|
| 6,879,648 | B2 * | 4/2005 | Ebel, Sr. ........................ | 375/340 |
| 7,881,673 | B2 * | 2/2011 | Kent .................... | H04B 7/0857 |
| | | | | 370/208 |
| 7,965,649 | B2 * | 6/2011 | Tee ........................ | H04L 1/0026 |
| | | | | 370/252 |

(Continued)

FOREIGN PATENT DOCUMENTS

| | | |
|---|---|---|
| EP | 1 022 860 B1 | 4/2003 |
| WO | WO 2004/049661 A1 | 6/2004 |

OTHER PUBLICATIONS

European Search Report for EP Application No. 09153884.3 mailed Aug. 21, 2009.

(Continued)

*Primary Examiner* — Loan L. T. Truong

(74) *Attorney, Agent, or Firm* — Borden Ladner Gervais LLP; Todd A. Keeler

(57) ABSTRACT

A method and device for performing forward error (FEC) correction avoidance based upon predicted block code reliability in a communications device is provided. An avoidance unit comprising a metric computation unit and a decision unit generates a reliability metric based upon a received code block. The reliability metric is compared to a reliability threshold, and the forward error correction decoder in the communications device is disabled if the metric is below or equal to the threshold.

21 Claims, 5 Drawing Sheets

(56) References Cited

U.S. PATENT DOCUMENTS

| | | | |
|---|---|---|---|
| 2003/0053435 A1* | 3/2003 | Sindhushayana et al. | 370/342 |
| 2003/0058820 A1* | 3/2003 | Spencer et al. | 370/332 |
| 2005/0105589 A1* | 5/2005 | Sung | H04W 52/24 375/130 |
| 2005/0128993 A1* | 6/2005 | Yu | H04B 7/061 370/342 |
| 2005/0207367 A1* | 9/2005 | Onggosanusi | H04L 1/0003 370/315 |
| 2006/0251180 A1* | 11/2006 | Baum | H04L 1/0003 375/260 |
| 2007/0008943 A1* | 1/2007 | Grant | H04B 7/061 370/342 |
| 2007/0076810 A1* | 4/2007 | Herrera et al. | 375/261 |
| 2007/0110095 A1* | 5/2007 | Attar et al. | 370/458 |
| 2010/0122139 A1* | 5/2010 | Wang et al. | 714/752 |
| 2011/0032919 A1* | 2/2011 | Mouhouche | H04L 25/03019 370/342 |

OTHER PUBLICATIONS

Lei Wan, Shiauhe Tsai, Magnus Almgren—"A fading-Insensitive Performance Metric for a Unified Link Quality Model". 2006.

Shu-Der Lan, Jieh-Hwang Yen, Lan-Rong Dung—on low-Power Turbo Decoder Design using Early Give-Up and Reuse Techniques.

"System-Level evaluation of OFDM—further considerations" TSG-RAN WG1#35, R1-031303.zip Lisbon, Portugal Nov. 17-21, 2003.

* cited by examiner

FORWARD ERROR CORRECTION DECODING AVOIDANCE BASED ON PREDICTED CODE BLOCK RELIABILITY

TECHNICAL FIELD

The present disclosure relates to communications networks and in particular to forward error correction (FEC) avoidance in a receiver of a communication device operating in the communications network.

BACKGROUND

In broadband wireless networks the general assumption in existing receivers is that all received code blocks must be decoded. Decoding of forward error correction (FEC) codes (such as turbo codes) is a very expensive operation that consumes a significant amount of power in the receiver of a communications system. Operation of the FEC decoder, particularly inefficient operation of the FEC decoder when signal conditions or channel quality is poor, directly impacts power consumption and particularly battery life of the mobile wireless communications device.

Broadband wireless communication systems such as Universal Mobile Telecommunications System (UMTS), High-Speed Downlink Packet Access (HSDPA) or 3GPP Long-Term Evolution (LTE) wireless networks employ Hybrid-ARQ (automatic repeat request) error control method in the receive path to improve the ability of the decoder to successfully decode in poor signal conditions. With HARQ each code block (or set of code blocks) has a set of parity bits from a cyclic redundancy check (CRC) appended to the information bit stream. These parity bits allow the receiver of the mobile wireless communications device to determine if the set of hard bit decisions is correct. Subsequent to the decoding and CRC check the receiver sends a message to the transmitter 102 indicating the success of the decoding. If the CRC passes a positive acknowledgment is transmitted (an ACK). If the CRC fails the receiver sends a negative acknowledgment (NAK) to the transmitter 102. The transmitter 102 upon reception of a NAK will retransmit a subset of the bits in the code block. The receiver will then combine these retransmitted bits with the information from the original transmission and attempt a second decoding. With each retransmission the probability of successfully decoding the transmission is increased as the signal energy is accumulated and the benefits of diversity are realized. This retransmission process may be repeated several times until the decoding succeeds or some maximum number of retransmissions has been reached. During this process the decoder may still be processing code blocks with little or no potential success of decoding and the FEC decoder utilizes resources to decode blocks with low probability of success. The inefficient operation of the FEC decoder has a direct impact on power consumption of the communications device and particularly the battery life in a mobile wireless communications device.

Therefore there is a need for improved utilization of the FEC decoder in the receiver of communication devices.

BRIEF DESCRIPTION OF THE DRAWINGS

Further features and advantages will become apparent from the following detailed description, taken in combination with the appended drawings, in which.

It will be noted that throughout the appended drawings, like features are identified by like reference numerals.

DETAILED DESCRIPTION

In the present disclosure there is provided a method for performing forward error correction (FEC) avoidance in a receiver of a communications device to conserve power based on predicted received code block reliability. A reliability metric value of one or more received code blocks wherein the reliability metric value increases with increasing probability of decoding success is determined. A code block reliability threshold value is then determined. The reliability metric value to the reliability threshold value are compared and a FEC decoder in the communications device is disabled when the reliability metric is below or equal to the reliability threshold.

There is also provided a forward error correction (FEC) avoidance device for use in a communications device to conserve power. The device comprises a metric computation unit for determining a reliability metric value of one or more received code blocks processed by a receiver wherein the reliability metric value increases with increasing probability of decoding success. A decision unit for determining a reliability threshold value and comparing the reliability metric value to the reliability threshold value to selectively disable a FEC decoder of the communications device to avoid the decoding process.

Power consumption is the communications device is improved by determining a reliability metric related to received radio frequency (RF) channel quality, or any other type optical or electrical communication channel, from a transmitter 102 in a communication network. The reliability metric is used to predict when the FEC decoder is likely to fail based on predicted code block reliability. The FEC decoder can then be disabled thus conserving power when the metric is below or equal to a defined reliability threshold and enabled when conditions improve and the metric is above the reliability threshold. The decoder is enabled or disabled, or alternatively bypassed, as required to conserve power based upon the implementation of the avoidance unit in the receiver. A HARQ unit can be utilized in conjunction with the avoidance unit, wherein if the FEC decoding unit is disabled or bypassed, the HARQ unit is instructed to send a NAK to the transmitter 102 to request a retransmission thereby increasing the probability of a successful decode. The ability to conserver power is particularly relevant to mobile wireless communications devices but is also applicable to fixed wireless communications devices, terrestrial or satellite, relays, peer-to-peer, and also wireline, optical, acoustic, ultrasonic, etc. communication systems where power consumption of the decoder may be an issue.

Figure 1:
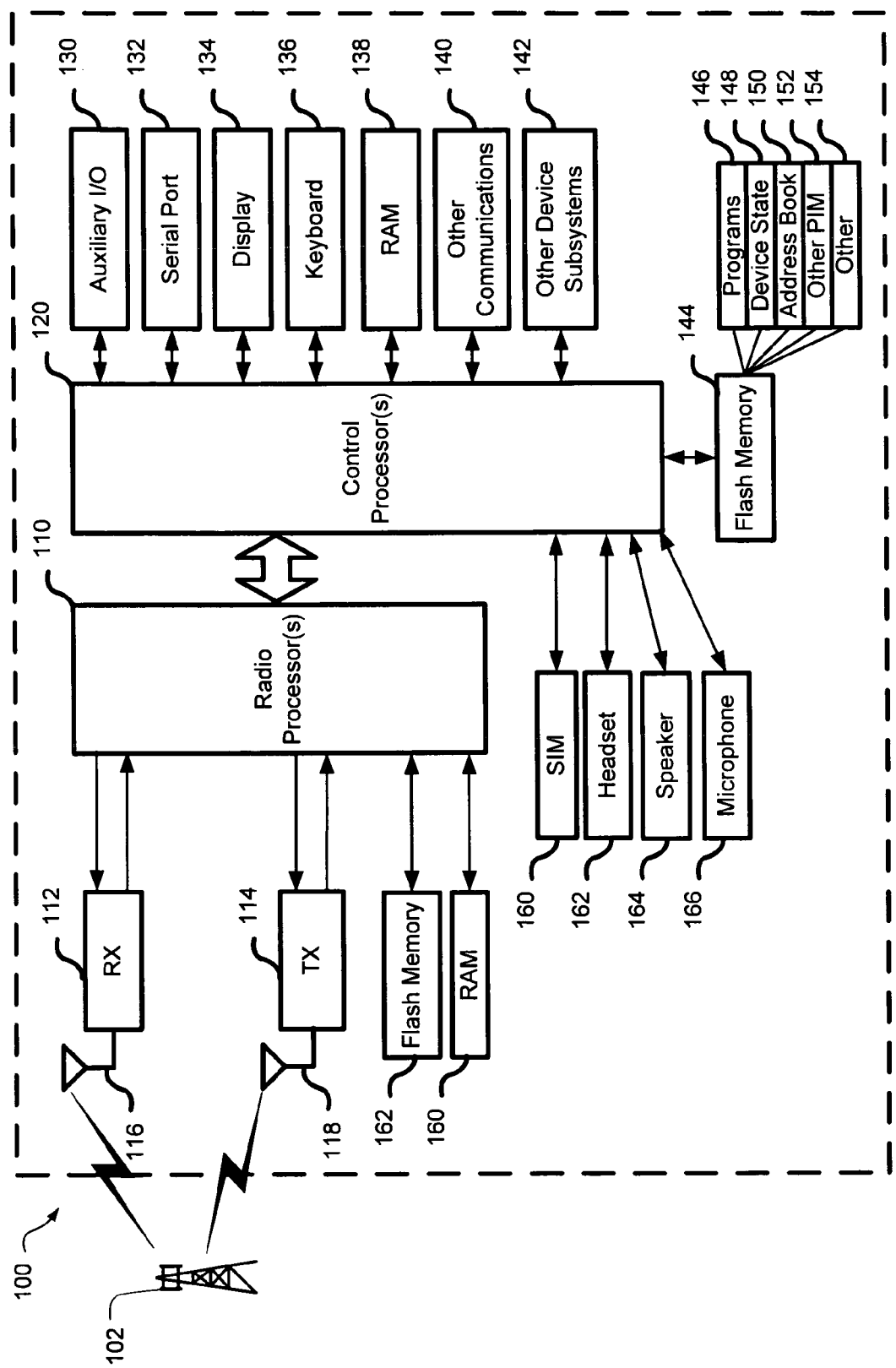
FIG. 1 is a block diagram of communications device, in particular a mobile wireless communications device.

FIG. 1 is a block diagram of a communication device 100, such as a mobile wireless communications device incorporating a communication subsystem having both a receiver (RX) 112 and a transmitter (TX) 114 for performing modulation and demodulation, as well as associated components such as one or more embedded or internal antenna elements 116 and 118, and a radio processor(s) 110 which may include one or more digital signal processors or application specific integrated circuits for performing decoding and encoding functions. The particular design of the communication subsystem will be dependent upon the communication network in which the device is intended to operate such as in a UMTS, HSDPA, 3GPP LTE or future 4G wireless networks. It should be understood that portions of the mobile wireless communications device 100 shown are specific to a mobile wireless communications and smart phone operation, however the structure may be modifiable to apply to other communications devices in regards to explaining the subject matter of the present disclosure.

The communications device 100 performs synchronization, registration or activation procedures by sending and receiving communication signals over a communications link, for example an RF channel from a transmitter 102, or in the case of a mobile wireless network a base station. Downlink signals received by antenna 116 through communication network 100 are input to receiver 112, which may perform such common receiver functions as signal amplification, frequency down conversion, filtering, channel selection and the like, and for example analog to digital (A/D) conversion. A/D conversion of a received signal allows more complex communication functions such as demodulation, decoding and synchronization to be performed in a digital signal processor (DSP). Decoding may utilize any type of FEC decoder, such as for example but not limited to a turbo decoder, a low-density parity-check (LDPC) decoder, a block code decoder, a Reed-Solomon decoder, a product code decoder, or a convolutional decoder in the decoding process. In addition any air interface technology (CDMA, OFDM, etc.) and receiver structure may be used with modifications to the reliability metric used to predict the code block reliability.

In a similar manner, signals to be transmitted are processed, including modulation and encoding for example, by a DSP and input to transmitter 114 for digital to analog conversion, frequency up conversion, filtering, amplification and transmission over the communication network via antenna 118. The radio processor(s) 110 not only processes communication signals, but also provides for receiver and transmitter control. One or more DSPs are located on radio processor(s) 110 with network communication functions performed through radio processor(s) 110. Radio processor(s) 110 interacts with receiver 112 and transmitter 114, and further with flash memory 122, random access memory (RAM) 124.

Control processor(s) 120 interacts with further device subsystems such as the display 124, flash memory 144, random access memory (RAM) 138, auxiliary input/output (I/O) subsystems 130, serial port 132, input device(s) 136, subscriber identity module 160, headset 162, speaker 164, microphone 166, other communications devices 140 and other device subsystems generally designated as 142. Data is provided to and received from radio processor(s) 110 to control processor(s) 120.

Some of the subsystems shown in FIG. 1 perform communication-related functions, whereas other subsystems may provide "resident" or on-device functions. Notably, some subsystems, such input devices 136 and display 122, for example, may be used for both communication-related functions, such as entering a text message for transmission over a communication network, and device-resident functions such as a calculator or task list. The input devices 136 may comprise but not be limited to keyboard, trackball, thumbwheel or touch screen.

Software used by radio processor(s) 110 and control processor(s) 120 is preferably stored in a persistent store such as flash memory 122 and 144, which may instead be a read-only memory (ROM) or similar storage element (not shown). It will be appreciated that the operating system, specific device applications, or parts thereof, may be temporarily loaded into a volatile memory such as RAM 124 and RAM 138. Received communication signals may also be stored in RAM 124.

As shown, flash memory 144 can be segregated into different areas for computer programs 146, device state 148, address book 150, other personal information management (PIM) 152 and other functionality generally designated as 154. These different storage types indicate that each program can allocate a portion of flash memory 144 for their own data storage requirements. Control processor(s) 120, in addition to its operating system functions, preferably enables execution of software applications on the communications device.

For voice communications, overall operation of communications device 100 is similar, except that received signals would preferably be output to the speaker 164 or headset 162 and signals for transmission would be generated by the microphone 166. Other device subsystems 140, such as a short-range communications subsystem, is a further optional component which may provide for communication between wireless mobile device 100 and different systems or devices, which need not necessarily be similar devices. For example, the subsystem 140 may include an infrared device and associated circuits and components or a Bluetooth™ communication module to provide for communication with similarly enabled systems and devices.

Figure 2:
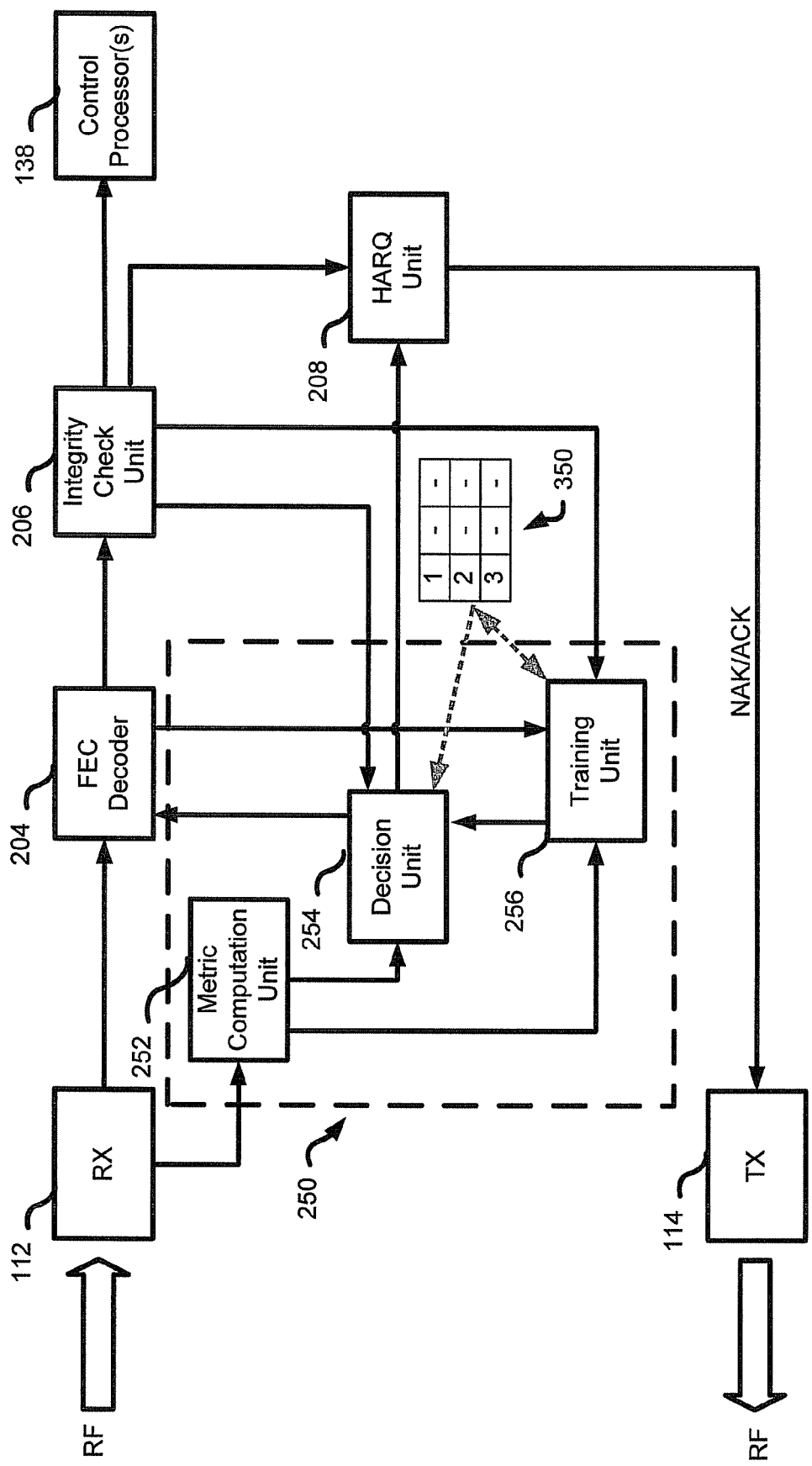
FIG. 2 is a schematic representation of a FEC avoidance unit in a communications device receiver.

FIG. 2 is a schematic representation of a FEC avoidance device 250. The device may be integrated as a dedicated integrated circuit or as multiple components as required. In addition, some of the logic functions may be implemented as part of the radio processor(s) 110 or control processor(s) 120 depending on the design considerations. The FEC avoidance apparatus 250 comprises a metric computation unit 252 for determining a metric value associated with a received signal, a decision unit 254 for determining if the FEC decoder 204 should be disabled or enabled and a training unit 256 for determining threshold values to be used in comparison to the determined metric. These units may be discrete components (or units), an integrated unit or incorporated in other components of the wireless mobile device. The avoidance device 250 disables or blocks the operation of the FEC decoder 204 through communication with the FEC decoder 204 to stop decoding of the incoming code blocks.

The metric computation unit 252 utilizes RF channel characteristics to generate a reliability metric associated with the quality of the channel (or received signal) from the receiver 112 to measure the code block reliability. It is beneficial to estimate the code block reliability across all (or a subset of) of the code blocks in the transport block and to adjust the threshold based on the overall statistics of the transport block. These overall statistics could be a single measure across all the bits in all the code blocks, or it could be a measure derived from the individual measures for each code block (such as the average, variance, or number above or below a certain threshold). These additional statistics could then be used to estimate the overall probability of decoding the whole transport block successfully. For instance, if all of the code blocks have a high reliability metric except for one code block then it may make sense to have a low threshold (so that all code blocks will likely be decoded) since it is relatively likely that the whole transport block may be decoded successfully. Consider now the opposite situation. If many of the code blocks within the transport block have a poor code block reliability then it is likely that at least one of these will fail and the overall success of decoding the transport block is therefore low. In this case it makes sense to have a high threshold, or perhaps to avoid processing all of the code blocks in the transport block altogether (which can be considered a special case where we set the threshold extremely high).

A number of different metrics may be applicable, for example for some systems such as code division multiple access (CDMA) systems the Signal-to-Interference-plus-Noise Ratio (SINR) would be a measure for indicating the likelihood of decoding success. For orthogonal frequency division multiplexing (OFDM) systems, the SINR generally varies from bit-to-bit and so a better measure would incorporate additional statistics about the distribution of SINRs across the bits, such as the variance leading to a two-dimensional metric with decision regions rather than a single dimension. One common one-dimensional metric is an "effective SINR" computed using the Effective Exponential SNR Mapping (EESM). The EESM takes the SINR on each of the individual subcarriers and combines them to yield an effective SINR value. A third measure that is more accurate than the EESM and is more applicable to a mixed modulation scenario is one based on a mutual information measure. Here there are separate modulation and coding models. The modulation model maps the SINR of each of the individual subcarriers to a symbol-by-symbol mutual information based on the modulation order. The coding model then maps the sum or average of the mutual information values across the code block to a decoding reliability measure.

The decision unit 254 utilizes a retrieved threshold to compare to the reliability metric from the metric computation unit to selectively enable or disable the FEC decoding. Threshold values may be preloaded in memory during an initial software load or programming of the wireless mobile device. The threshold is determined through empirical evaluation with the particular decoder being employed or during a training process performed during normal operation of the receiver using a training unit 256. The threshold must be set in such a way that the probability of falsely predicting decoder failure (i.e. declaring failure but the decoding would have succeeded) is low. Otherwise, the receiver will have to demodulate another code block retransmission that may not have been necessary, thereby possibly increasing the overall power consumption.

A table 350, stored in memory may be provided, that contains the reliability threshold values. The threshold values may also be associated with particular channel parameters so that different threshold values may be utilized for different channel configurations. The threshold may be based on a number of parameters associated with the FEC decoder performance in relation to the metric. Therefore the threshold may be a function of the desired false detection probability; a function of the maximum number of iterations of the FEC decoder; a function of the code rate; a function of the code block size; a function of the means by which the FEC decoder is implemented; or a function of the number of retransmissions received or number of retransmissions remaining (before the maximum is reached) for a given HARQ process.

The training unit 256 can be used to determine or refine threshold values to be used by the decision unit 254. The receiver may go into a training mode where it computes the metric but completes the decoding to determine which threshold to utilize. The training unit can also track the success of the decoder against the metric values and over time adjust the threshold value to yield a more accurate prediction of FEC decoder success to improve decode efficiency. The training unit 256 modifies or populates threshold values in table 350 during the training process. The table can be stored in memory such as 160 or 162 or in dedicated memory associated with the avoidance apparatus 250 and may be adapted in real-time at the receiver.

In the receive path, an integrity check unit 206 performs a CRC or similar check on the received data blocks upon which decoding has been performed. The integrity check determines if the received code block is intact and therefore contains valid data. Data that passes the CRC check is passed to the control processor(s) 120. The integrity check unit 206 notifies a HARQ mechanism, represented by unit 208, whether the CRC check passed or failed. In many wireless systems (such as LTE) the data is delivered in blocks called transport blocks. The data within a transport block is divided up into multiple code blocks. An additional CRC is appended to the transport block as a whole and if an error is detected the HARQ mechanism delivers a NAK to the transmitter to request a retransmission. In other words, an error in any of the code blocks within a transport block will trigger a NAK. As mentioned earlier, with HARQ there is usually a maximum number of retransmissions that may occur. If the current transmission is the last retransmission it is probably preferable to disable the unit and allow decoding. Note that the measure and decision may be able to be computed based on channel and noise estimates and thereby also allow for avoidance of performing full demodulation of the signal (i.e. further power savings). In a HARQ situation, however, one would likely want to perform this demodulation and soft combine the data from the multiple transmissions to allow for increased probability of success after future transmissions. The HARQ unit can then provide a NAK or ACK to the transmitter 114, by the appropriate encoding through the radio processor(s) 110 (not shown).

Figure 3:
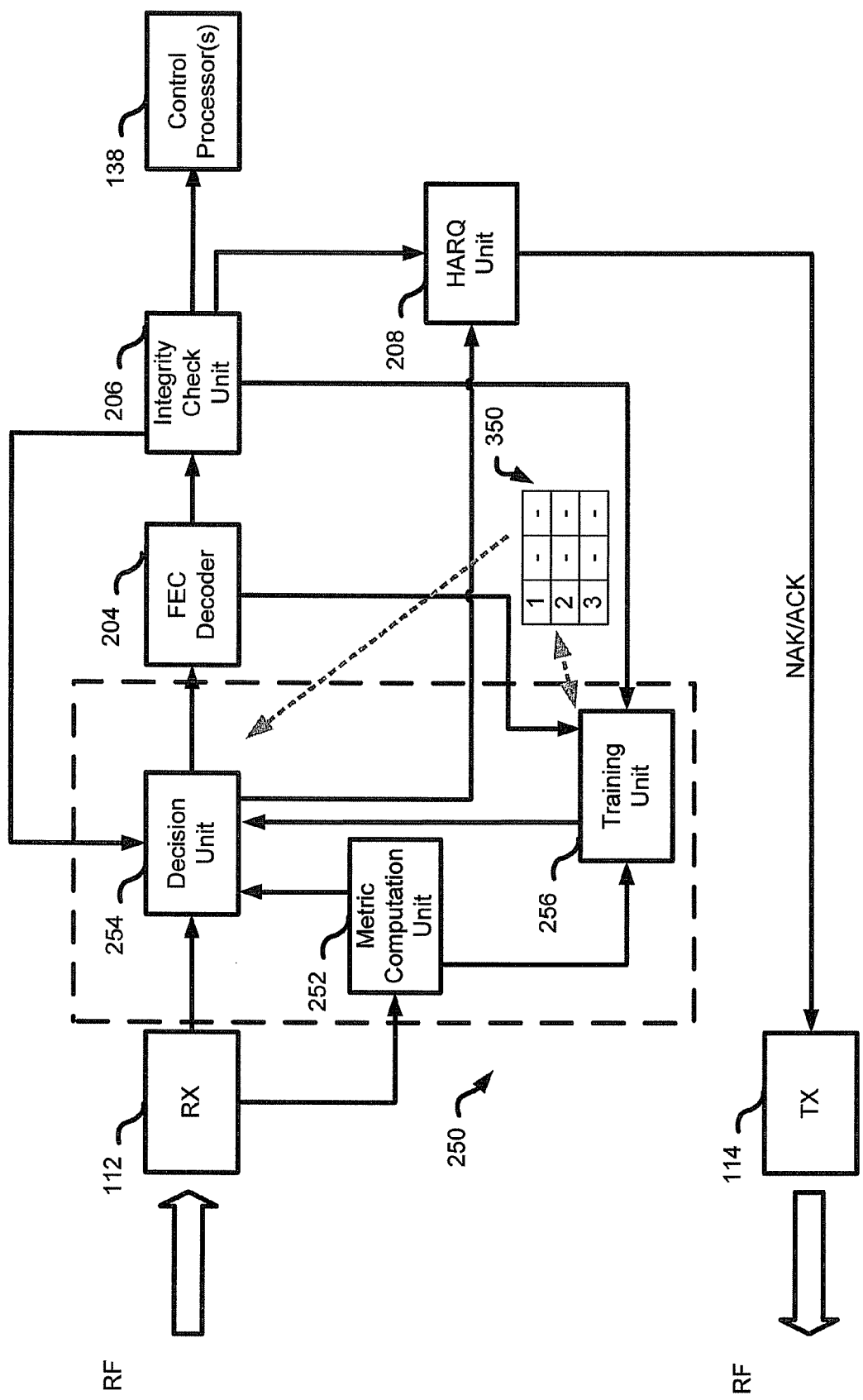
FIG. 3 is a schematic representation of a FEC avoidance unit in-line with a FEC unit of the communications device receiver.

FIG. 3 is an alternative configuration wherein the avoidance device 250 may be in-line with the received data from the receiver 112 and the FEC decoder 204 and may disable the FEC decoder by blocking data from being passed to the decoder. In this example the decision unit 254 selectively blocks or enables that received data stream to be passed to the FEC decoder 204.

Figure 4:
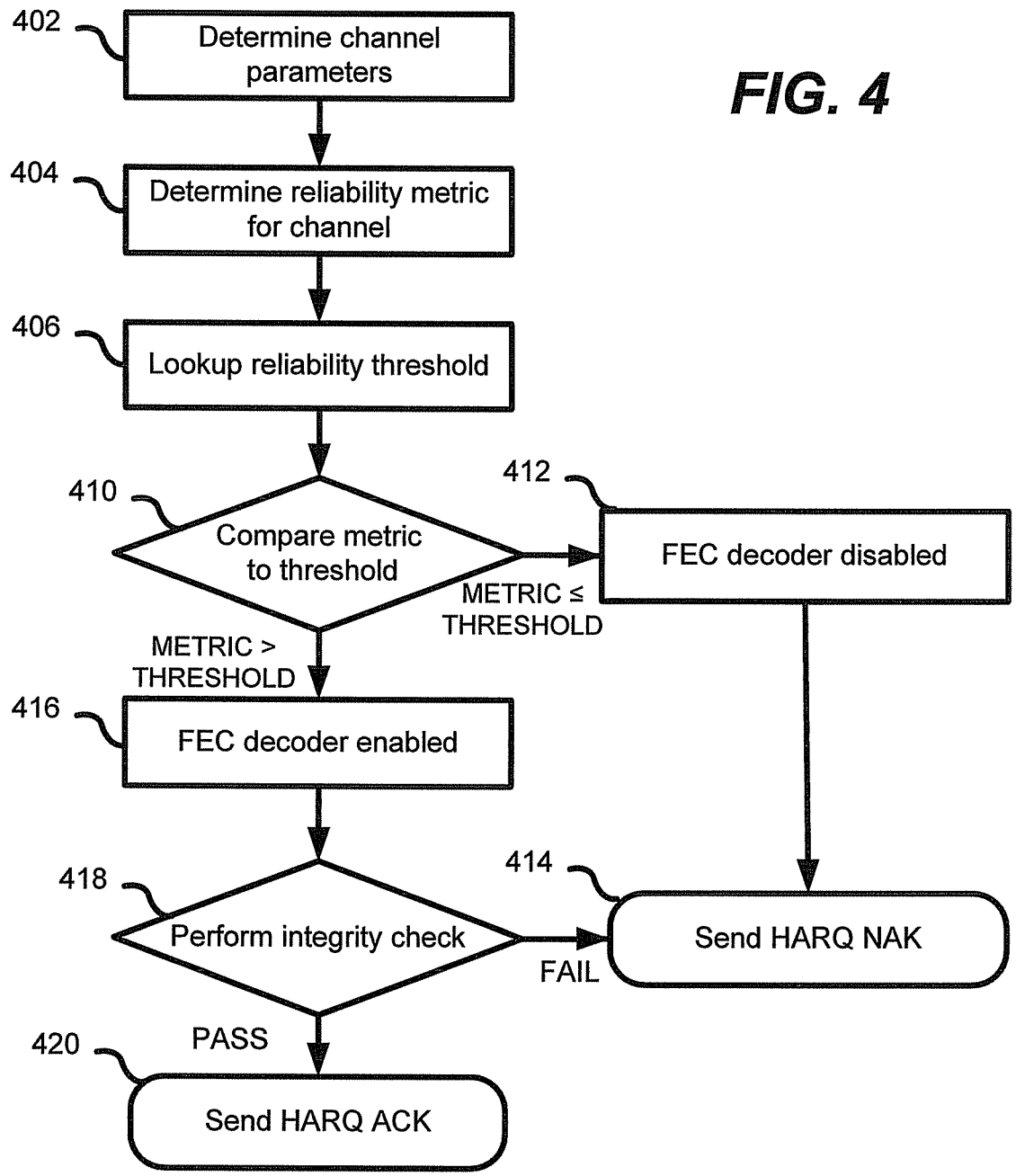
FIG. 4 is a flowchart of a method of performing FEC decode avoidance in a communication device receiver.

FIG. 4 is a method of performing FEC avoidance based upon predicted code block reliability. The method commences with the receiver down-converting a received signal and determining channel parameters 402. The channel parameters may be based upon modulation type, code block size, number of retransmissions, or code rate. A reliability metric is then determined 404 for the channel based upon a quality metric such as SINR of the received code blocks provided by receiver 112. Based upon the channel parameters a lookup can then be performed to determine an associated reliability threshold 406.

Alternatively a single threshold may be provided and used for all channel parameter configurations. The metric is then compared to the threshold 410. If the metric is above the threshold the FEC decoder is enabled 416. An integrity check is then performed 418 based upon an integrity test such as by determining a CRC for the received code block. If the integrity check passes, PASS at 418, a HARQ ACK 420 will be provided, by the HARQ mechanism to the transmitter of the wireless mobile device. If the integrity check fails, FAIL at 418, a HARQ NAK 414 will be provided, by the HARQ mechanism to the transmitter and back to the transmitter 102. In the case where the integrity check fails, but the metric is above the threshold, this indicates that the threshold is possibly too low and should be refined to a higher value. During the metric comparison at 410, if the metric is less than or equal to the threshold, the FEC decoder is avoided by being disabled 412 or bypassed. At this point it is assumed the integrity check would fail and a HARQ NAK 414 is sent to the transmitter 102.

Figure 5:
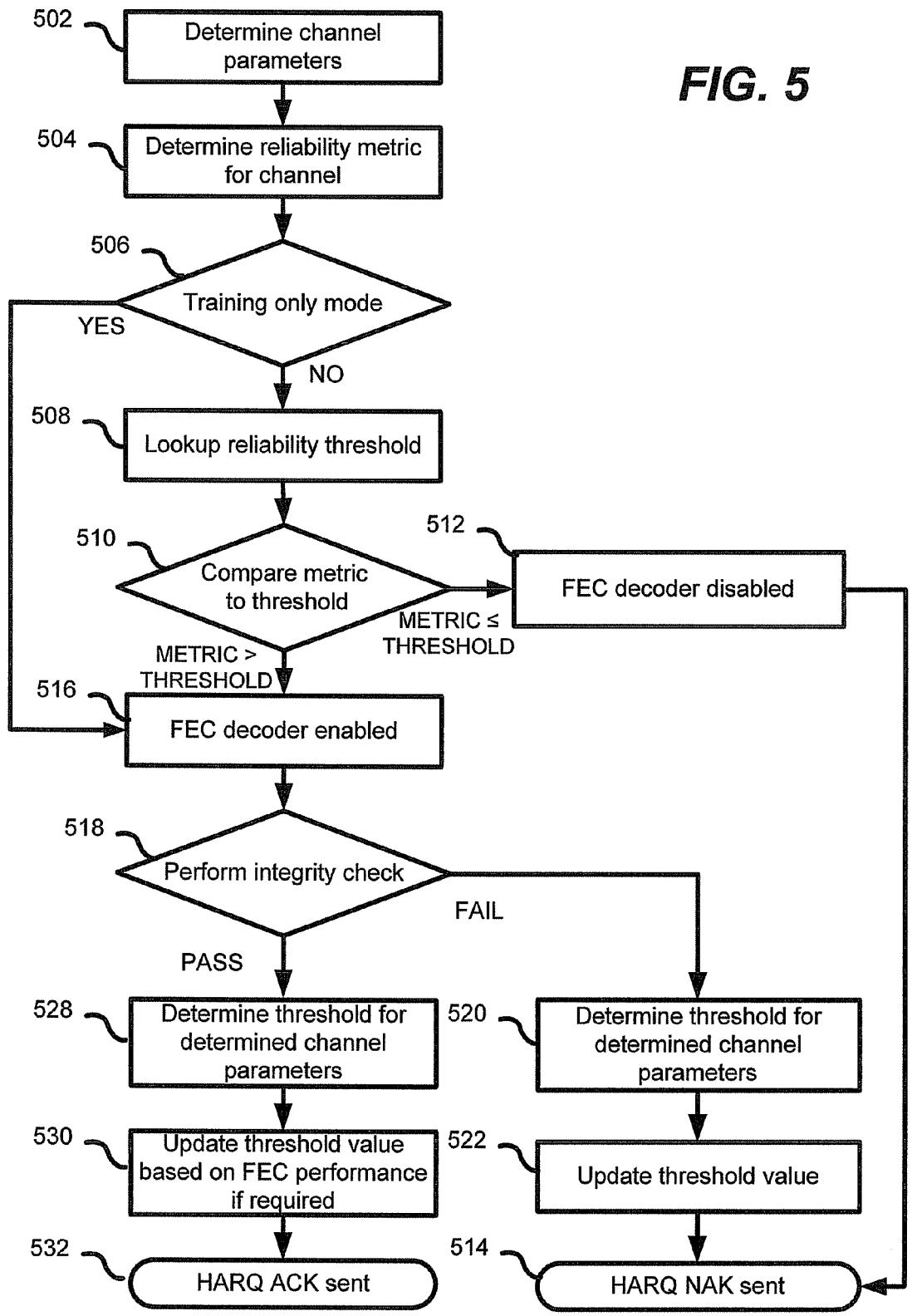
FIG. 5 is a flowchart of a method of performing FEC decode avoidance and training in a communication device receiver.

FIG. 5 is a method of performing FEC avoidance also comprising a training mode to determine an optimal reliability metric. The method commences with the receiver down-converting a received signal and determining channel parameters 502. The channel parameters may be based upon modulation type, code block size, number of retransmissions, or code rate. A reliability metric is then determined 504 for the channel based upon a quality metric such as SINR of the received code blocks. If the wireless mobile device is provided without threshold information populated in the avoidance table, a training mode 506 may be initiated to determine the metric value for successful decoding. If the training mode is enabled, YES at 506, the FEC decoder is enabled 516 and the received signal is processed. If the training mode is not enabled, NO at 506, it is assumed that the reliability threshold value is available or does not need to be refined. Using the determined channel parameters, a lookup can then be performed to determine the associated reliability threshold 508 if unique threshold values are defined for different channel configurations. The metric is then compared to the threshold 510. If the metric is above the threshold the FEC decoder is enabled 516. If the metric comparison at 510 is less than or equal to the reliability threshold, the FEC decoder is avoided by being disabled 512 or bypassed and a HARQ NAK 514 is sent back to the transmitter 102.

When the decoder is enabled, an integrity check is then performed 518 on the received code blocks. If the integrity check passes, PASS at 518, a reliability threshold for the determined channel parameters is determined 528. The reliability threshold value is then updated at 530 and a HARQ ACK 532 is then sent to the transmitter 102. If the integrity check fails, FAIL at 518, a reliability threshold for the determined channel parameters is determined 520. The reliability threshold value is then updated at 522 and a HARQ NAK 514 is then sent to the transmitter 102.

The training mode may available at any time when the wireless mobile device is operating or configurable during specific operations such as initialization or after a specified number of failed threshold decodes.

The device and methods according to the present disclosure may be implemented by any hardware, software or a combination of hardware and software having the above described functions. The software code, either in its entirety or a part thereof, may be stored in a computer-readable memory. Further, a computer data program representing the software code may be embodied on a computer-readable memory. Although the avoidance unit is described in terms of units, the functions of the avoidance unit may be integrated into other components of the wireless mobile device such as the receiver, decoder or radio processors.

While a particular embodiment of the present device and methods for FEC decoder avoidance has been described herein, it will be appreciated by those skilled in the art that changes and modifications may be made thereto without departing from the disclosure in its broadest aspects and as set forth in the following claims.

The invention claimed is:

1. A method for performing forward error correction (FEC) avoidance in a receiver of a communications device, the method comprising:
   determining a reliability metric value of one or more received code blocks wherein the reliability metric value increases with increasing probability of decoding success and is based on the actual reception of code blocks;
   determining a code block reliability threshold value;
   comparing the reliability metric value to the reliability threshold value; and
   disabling a FEC decoder in the communications device when the reliability metric is below or equal to the reliability threshold wherein the reliability metric is a measure based on the collective statistics of a Signal-to-Interference-plus-Noise Ratio (SINR) of the individual bits in the code block.

2. The method of claim 1 further comprising enabling the FEC decoder when the reliability metric is above the reliability threshold.

3. The method of claim 2 further comprising determining channel parameters of the received channel, the channel parameters comprising one or more of modulation type, code block size, number of retransmissions, or code rate.

4. The method of claim 2 further comprising performing an integrity check on decoded code blocks and sending a Hybrid Automatic Repeat request (HARQ) acknowledgment (ACK) to a transmitter when the integrity check is successful, sending a HARQ negative acknowledgment (NAK) when the integrity check is not successful and sending a HARQ NAK when the FEC decoder is disabled.

5. The method of claim 3 wherein the determining of the reliability threshold further comprises performing a lookup of the reliability threshold value in a table stored in memory, the table containing one or more reliability threshold values, each threshold being associated with defined channel parameters.

6. The method of claim 5 further comprising entering a training mode comprising:
   enabling the FEC decoder;
   performing an integrity check on decoded code blocks and if the integrity check fails:
   determining a threshold value for the determined channel parameters;
   updating a threshold in a threshold table for the determined channel parameters based upon the failure of the decoding if the reliability metric exceeds the threshold;
   sending the HARQ NAK to a transmitter in a communications network.

7. The method of claim 6 wherein if the integrity check passes:
   determining the threshold value for the determined channel parameters;
   updating a threshold in a threshold table for the determined channel parameters based upon the success of the decoding if the reliability metric is below or equal to the threshold;
   sending the HARQ ACK to the transmitter in the communications network.

8. The method of claim 1 wherein the communications device is a mobile wireless communications device operable in a mobile wireless communications network.

9. A forward error correction (FEC) avoidance device, for use in a communications device, the FEC avoidance device comprising:
   a metric computation unit for determining a reliability metric value of one or more received code blocks processed by a receiver wherein the reliability metric value increases with increasing probability of decoding success and is based on the actual reception of code blocks; and
   a decision unit for determining a reliability threshold value and comparing the reliability metric value to the reliability threshold value to selectively disable a FEC decoder of the communications device to avoid the decoding process when the reliability metric is below or equal to the reliability threshold wherein the reliability metric is a measure based on the collective statistics of a Signal-to-Interference-plus-Noise Ratio (SINR) of the individual bits in the code block.

10. The forward error correction avoidance device of claim 9 further comprising:
a training unit, which when operating in a training mode, uses pass or fail results of an integrity check performed on received code blocks to determine if the reliability threshold should be added or modified based upon a determined reliability metric value.

11. The forward error correction avoidance device of claim 9 wherein the decision unit requests that a hybrid automatic request (HARQ) negative acknowledgment by a HARQ process be sent to a transmitter when the FEC decoder is disabled.

12. The forward error correction avoidance device of claim 9 further comprising a table stored in memory of the communications device, the table containing one or more threshold entries associated with one or more channel parameters wherein the decision unit determines the threshold value by performing a lookup in the table.

13. The forward error correction avoidance device of claim 12 wherein the channel parameters of the received RF channel comprising one or more of modulation type, code block size, number of retransmissions, or code rate.

14. The forward error correction avoidance device of claim 13 wherein the training unit utilizes results of an integrity check on decoded code blocks when the decoder is enabled, and if a fail result occurs determines a threshold for the determined channel parameters; updates a threshold value in a threshold table for the determined channel parameters based upon the failure of the decoding if the reliability metric exceeds the threshold; and if a pass result occurs determines a threshold for the determined channel parameters; updates a threshold value in a threshold table for the determined channel parameters based upon the success of the decoding if the reliability metric is below or equal to the threshold.

15. The forward error correction avoidance device of claim 14 wherein the FEC decoder is one of a turbo decoder, a low-density parity-check (LDPC) decoder; a block code decoder, a Reed-Solomon decoder, a product code decoder, or a convolutional decoder.

16. The forward error correction avoidance device of claim 9 wherein the decision unit disables the decoder by blocking code blocks from being transferred to the decoder or by communicating with the decoder to stop the decoding process.

17. The forward error correction avoidance device of claim 9 wherein the communications device is a mobile wireless communications device operable in a mobile wireless communications network.

18. The method of claim 1 wherein the collective statistics comprise Signal-to-Interference-plus-Noise Ratio (SINR) average measurement with the measurement being made over the code block.

19. The method of claim 1 wherein the collective statistics comprise Effective Exponential SNR mapping (EESM) measurement with the measurement being made over the code block.

20. The method of claim 1 wherein the collective statistics comprise mutual information measure of the received RF channel with the measurement being made over the code block.

21. The method of claim 1 comprising:
deciding whether or not to decode a transport block, the transport block comprising multiple code blocks, by:
determining the reliability metric for each code block of the transport block;
as a function of the individual reliabilities of the code blocks, deciding whether or not to decode the code blocks of the transport block.

* * * * *